United States Patent [19]

Miller

[11] 4,368,424
[45] Jan. 11, 1983

[54] MUTUAL INDUCTANCE CURRENT TRANSDUCER FOR AC ELECTRIC ENERGY METERS

[75] Inventor: Robert C. Miller, Penn Hills, Pa.

[73] Assignee: Westinghouse Electric Corp., Pittsburgh, Pa.

[21] Appl. No.: 149,356

[22] Filed: May 13, 1980

Related U.S. Application Data

[63] Continuation of Ser. No. 923,619, Jul. 11, 1978, abandoned.

[51] Int. Cl.³ .................... G01R 21/06; G01R 15/10; H01F 27/24
[52] U.S. Cl. .................................. 324/142; 324/132; 336/212
[58] Field of Search ........... 324/142, 141, 127, 117 R, 324/132; 336/155, 178, 212; 365/133; 307/401

[56] References Cited

U.S. PATENT DOCUMENTS

| 1,728,003 | 9/1929 | Nickle | 336/155 |
| 3,226,641 | 12/1965 | Miller | 324/142 |
| 4,147,978 | 4/1979 | Hicks | 324/142 |

Primary Examiner—Ernest F. Karlsen
Attorney, Agent, or Firm—Robert E. Converse, Jr.

[57] ABSTRACT

A mutual inductance current transducer includes a primary winding for direct connection to the current component of an electric energy quantity to be measured by an AC energy meter. A secondary winding is inductively coupled to the primary winding to produce an output signal that is proportional to the time derivative of the current component. The output circuit provides a current responsive input to an energy measuring circuit also receiving a voltage responsive input.

3 Claims, 5 Drawing Figures

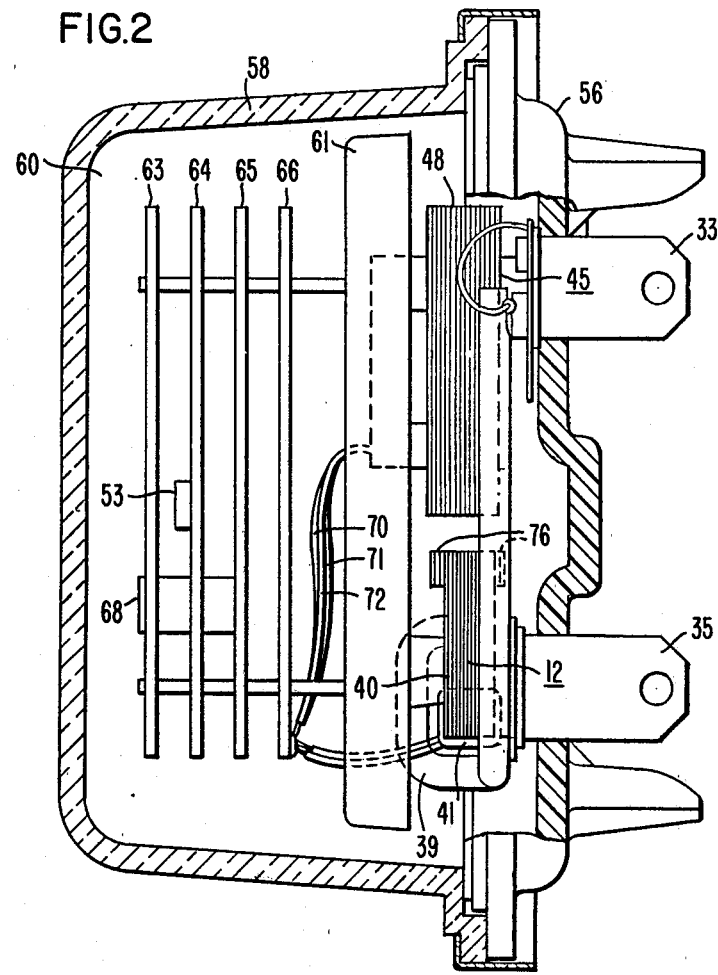

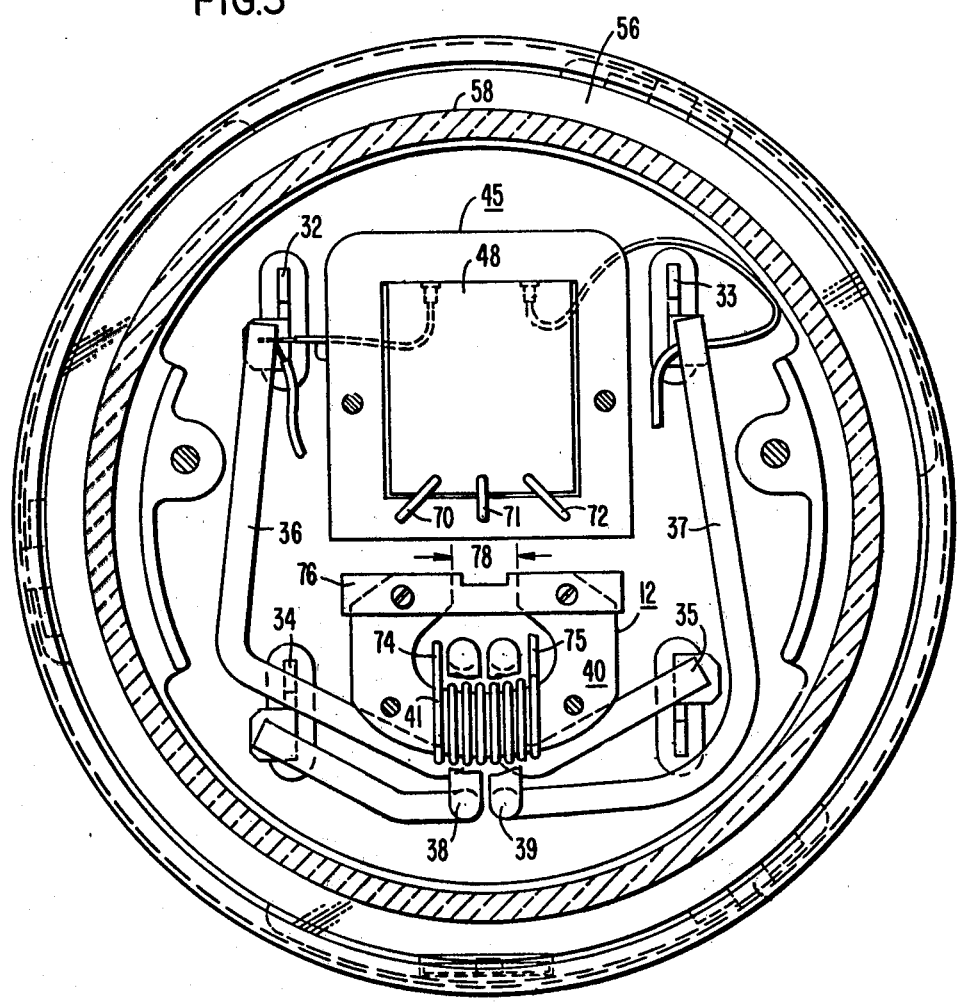

MUTUAL INDUCTANCE CURRENT TRANSDUCER FOR AC ELECTRIC ENERGY METERS

This application is a continuation of application Ser. No. 923,619, now abandoned, filed July 11, 1978, and assigned to the assignee of this invention.

BACKGROUND OF THE INVENTION

1. Field of the Invention

This invention relates to AC electric energy meters of the watthour meter type, including voltage and current sensing transducers for applying signals responsive to the current and voltage components of an electric energy quantity to be measured by electronic measuring circuits, and more particularly to such meters including a mutual inductance current sensing transducer capable of sensing widely varying amplitudes of the current component and producing low level output signals suitable for use by the electronic measuring circuits.

2. Description of the Prior Art

Devices for AC electric energy measurement are extensively used by producers of electric energy for measuring consumption by separate energy users. Typically, watthour meters are used for indicating consumption in kilowatt-hours. The watthour meters are usually of the induction type having a rotating disc, which are recognized as having high degrees of reliability and accuracy, being available at reasonable costs, and being capable of outdoor operation under widely varying extremes of temperature and other ambient conditions.

It is also known to measure AC electric energy quantities such as kilowatt-hours, volt-ampere hours, reactive volt-ampere hours, with electronic measuring circuits. Typically, voltage and current instrument transformers provide signals proportional to the voltage and and current components of an electric energy quantity to be measured. Analog multiplier circuit arrangements are known in one type of measuring circuit and they are arranged to produce a signal proportional to the time integral of the product of the voltage and current components. One electronic measuring circuit is described in U.S. Pat. No. 3,764,908, assigned to the assignee of this invention, wherein voltage and current signals are applied to a semiconductor device having a logarithmic computing characteristic. An output signal is produced therefrom which is proportional to the product of the voltage and current signals and a measured value of the electric power quantity.

Another known analog multiplier type of AC electric energy measuring circuit is referred to as a time-division-multiplication type of measuring circuit. In U.S. Pat. No. 3,864,631, assigned to the assignee of this invention, the technique of analog multiplication is disclosed. A voltage component signal is sampled to derive a variable pulse width modulated signal corresponding to the voltage component variations. A current component signal is sampled at a rate responsive to the variable pulse width signals. A resultant output is produced, consisting of a series of pulses having amplitudes proportional to the instantaneous current values and pulse widths proportional to the instantaneous voltage values. The resultant pulse signals are filtered to obtain an average value, or DC level, proportional to measured AC electric power. The average value signal controls a voltage-to-frequency conversion circuit, utilizing integrating capacitors. Variable frequency pulses from the conversion circuit are totalized, so that a total pulse count is a measure of the electric energy consumption.

In U.S. Pat. No. 3,343,084, assigned to the assignee of the present invention, voltage and current components of an electric energy quantity to be measured are applied to a Hall generator. The output of the Hall generator provides a signal proportional to the product of the voltage and current signal inputs. The Hall generator output is applied to a saturable core transformer integrating device to produce pulses which are proportional to the time integral of the Hall generator output or of the electric energy to be measured. The voltage and current inputs to the Hall generator are applied from the detachable contact terminals of a detachable watthour meter.

In U.S. patent application Ser. No. 064,603, filed Aug. 7, 1979, now U.S. Pat. No. 4,255,707, which is a continuation of U.S. patent application Ser. No. 919,874, filed June 26, 1978, now abandoned, both assigned to the assignee of this invention, an AC electric energy measuring circuit and method is described wherein the voltage component of an electric energy quantity to be measured is converted by electric circuit techniques to a signal proportional to the time integral of the voltage component. The time integral voltage signal is compared to incremental reference levels. Each instance that a referenced level is reached, the instantaneous magnitude of the current component is sampled and converted to digital signals. These digital signals are summed to produce an output signal corresponding to a measure of AC electric energy in watt-hours. Some of the component drift disadvantages of prior analog multiplier circuits are avoided by the aforementioned circuit.

A further example of an electric energy measuring circuit is disclosed in U.S. Pat. No. 4,077,061, assigned to the assignee of this invention, where analog-to-digital sampling of the voltage and current components is performed for subsequent digital processing and calculation. A number of different electric energy parameters are calculated by digital computational circuit techniques.

In each of the aforementioned circuit techniques for electric energy measurements, the voltage and current inputs to the AC energy measuring circuit are provided directly by the line voltage and current or by instrument transformers for producing signals proportional to the line voltage and current components of the electric energy quantity being measured. Although electronic circuits are operable in small signal ranges, the electric power voltage and currents are several magnitudes larger. Thus, the sensing transducers which provide the voltage and current responsive inputs to the measuring circuits must have large transformation ratios. Also, the sensing transducer's response must be linear with the proportionalities between the input and output being constant. In the case of the current transducer, the linear response must be over a wide range of current values to be sensed.

In typical electric energy measurements at a utility customer location, sixty Hertz AC electric power is delivered at substantially constant line voltages of either one hundred-twenty or two hundred-forty volts defining the voltage components of the electric energy quantity to be measured. On the other hand, load currents which define the current component of the electric energy quantity to be measured vary considerably. In measuring operation, a substantially linear response is desired in a general range of from one-half ampere to two hundred amperes, or in a current variation ratio of approximately four hundred to one. With line current values above 200 amperes and below one-half ampere degradation of the linear response begins to occur in many systems. Accordingly, standard potential transformer arrangements can provide practical voltage sensing transducers. However, current transformers receiving the aforementioned substantially wide input variations, with a ratio in the order of four hundred to one, and producing low level signal outputs require arrangements which are often of substantial size and cost. When it is desired to manufacture electronic AC energy measuring circuits and devices which are relatively compact and comparable in cost to the aforementioned conventional induction type watthour meters, the voltage and current sensing transducers present substantial contributions to the overall size and cost of such devices. As is known in accurate current transformer transducers, the ampere turns of the primary and of the secondary must be equal, and since current levels can produce 400 ampere-turns in the primary, the secondary winding sizes become substantial in order to produce linear low level signal outputs resulting in current transformers that are bulky and are relatively costly.

Accordingly, it is desirable to provide the voltage and current sensing transducers for electronic AC energy measuring circuits which are highly reliable and accurate and are adapted for standard connection to the conductors carrying the electric energy quantity to be measured, such as provided at service entrance conductors at a residential electric power user's location. It is further desirable that the current sensing transducer of such devices be compact, capable of mass production by economical manufacturing techniques and be operable to produce low level signal outputs accurately in response to large variations of load currents to be sensed.

SUMMARY OF THE INVENTION

In accordance with the present invention, mutual inductance current sensing transducer is provided by a secondary coil inductively coupled to a primary circuit carrying a line current having wide ratios of variation and having the secondary coil producing analog signals for AC electric energy measurement that are proportional to the time derivative of line current. One preferred embodiment of the transducer is formed by a laminated, magnetically permeable core, having an air gap space included in the path of the magnetic core flux. At least one large current-carrying primary circuit is positioned in close inductively coupled relationship with the core. Magnetic flux induced into the core and through the air gap is substantially proportional to the flow of the current to be sensed in the primary circuit. A secondary circuit is in close inductive relationship to the core to produce an induced voltage $e_i = M\, di/dt$, where M is the mutual inductance between the primary and secondary circuits and $di/dt$ is the time derivative of the primary current. The equation for the signal $e_i$ applies to primary and secondary circuits mutually coupled in any manner with or without a magnetic core but requires that no substantial current flows in the secondary circuit. When the transducer is connected to measure a line current component of an electric energy quantity to be measured, the induced voltage signal $e_i$ represents the time derivative of the line current component of the electric energy quantity. Accordingly, the signal $e_i$ is effective to provide the current responsive analog input signal to an electronic AC energy measuring circuit also receiving a voltage responsive analog input signal $e_v$. The signal $e_i$ is processed in the AC energy measuring circuit along with the signal $e_v$, representing the line voltage component of the energy to be measured, to produce a signal representative of alternating current energy consumption. The time integral of the voltage and current components of an electrical energy quantity over a predetermined time interval provides energy measurement in watthours.

The use of a magnetic core increases the inductive coupling between the coils forming the primary and secondary circuits in one form of the invention but a given change in current will not in general cause a precisely proportional change in the flux in the magnetic material of the coil. A compensation arrangement is provided for laminated shunt bars bridging the core air gap space. The compensating shunt bars saturate at high flux densities to compensate for non-linearities at low flux densities in the core which are at least partially due to the change of permeability with magnetic induction of the magnetic material forming the core. Thus, more linear response of the output signal $e_i$ is produced at the lower current values being sensed. The non-linear response effects of the magnetic core materials is further minimized by large air gap spacings and use of materials having high initial permeability.

An alternate compensation arrangement includes a compensating flux pick-up coil positioned adjacent the air gap. Fringe or stray flux densities at the air gap provide proportionately greater flux densities at low flux values than at higher flux values. The outputs of the compensating pick-up coil and of the secondary winding are both applied to a summing amplifier. The summing amplifier output provides an induced voltage $e_i$ proportional to the time derivative of the primary current $(di/dt)$ which is more linearly responsive to low flux densities in the core. The compensation arrangements may not completely accomplish constant linear magnetic response; however, further compensation in the electric energy measuring circuits is possible by modification thereof so that opposite response characteristics in the measuring circuits to the transducer non-linear output characteristics can result in an overall linear output in response to the transducer input current.

One preferred embodiment of the present invention includes an induction watthour meter electromagnetic portion including modified forms of the voltage electromagnet section and the current electromagnet section utilizing the same voltage and current windings and associated magnetic cores as when used in the electromagnetic portion for rotating disc operation of an induction watthour meter. A secondary winding is included in the voltage section to provide a line voltage responsive analog signal $e_v$ proportional to the voltage component of an electric energy quantity. A secondary winding is provided on the watthour meter current core to produce a line current responsive analog signal $e_i$. The electromagnetic portion is mounted in a conventional fashion to a watthour meter base carrying blade terminals for mounting in mating socket terminals of a meter-mounting box. A primary winding of the voltage section is connected across two line conductors and two heavy conductor primary windings of the current section are connected in series with the line conductors by connection to the blade terminals. Secondaries of the voltage and current sections produce voltage and current analog signals responsive to the electric energy quantity flowing in the line conductors. The voltage and current analog signals are applied to an associated AC energy measuring circuit mounted to the meter frame. The frame also carries the meter electromagnetic portion so that the complete watthour meter device includes a conventional meter housing including a cup-shaped cover mounted to the meter base.

In an alternative form of the magnetic core of the current sensing transducer, the core is formed in a layer configuration having layers of strip magnetically permeable material which are bent at spaced locations across the longitudinal axis so that the ends thereof are spaced to form a predetermined magnetic air gap. The core material is of an oriented magnetic steel having higher initial permeabilities. Two primary windings of the core are formed for series connection with two line current conductors. A secondary winding is formed thereon for providing low level signal outputs linearly responsive to the load current variations, typically in a ratio of one to four hundred. The layered core construction is preferably formed by strips cut from sheets of the oriented magnetic steel material having a high initial permeability.

A further alternative preferred embodiment includes an air core type of mutual inductance current sensing transducer having a secondary winding carried by nonmagnetic coil form and a pair of primary windings disposed substantially symmetrically to each other and to the secondary winding. The primary windings are connectable in series with the two line conductors having the wide ratios of line current variations and the secondary winding produces the analog signal proportional to the time derivative of line current.

Accordingly, the mutual inductance current sensing transducer of this invention produces an output signal responsive to the time derivative of a current component of an electric energy quantity to be measured which is responsive to current variations over wide ranges, such as produced by the line current variations supplied to residential customers of an electric power supplier. Such line current variations typically vary in a range of four hundred to one. The current sensing transducer is conveniently made in a modified form of a current electromagnet section of an induction watthour meter so as to be mountable to a watthour meter frame and housing. A voltage sensing transducer is also mounted to the frame so that both transducers are connected to blade terminals for conventional attachment to existing metering locations. The current sensing transducer provides an output signal suitable for applying the current responsive input of a low signal level electronic measuring circuit and the transducer is substantially insensitive to extraneous magnetic flux fields which may tend to vary or adversely affect the accuracy of the current responsive signals applied to the associated AC electric energy measuring circuit.

The above and other features and advantages of the present invention will become apparent from the detailed description of the preferred embodiments of this invention shown in the drawings briefly described hereinafter.

BRIEF DESCRIPTION OF THE DRAWINGS

FIG. 2 is a side elevational view with parts broken away of the AC electric energy meter shown in FIG. 1;

FIG. 3 is a cross-sectional view of FIG. 2 taken along the axis III—III and looking in the direction of the arrows;

DESCRIPTION OF THE PREFERRED EMBODIMENTS

Figure 1:
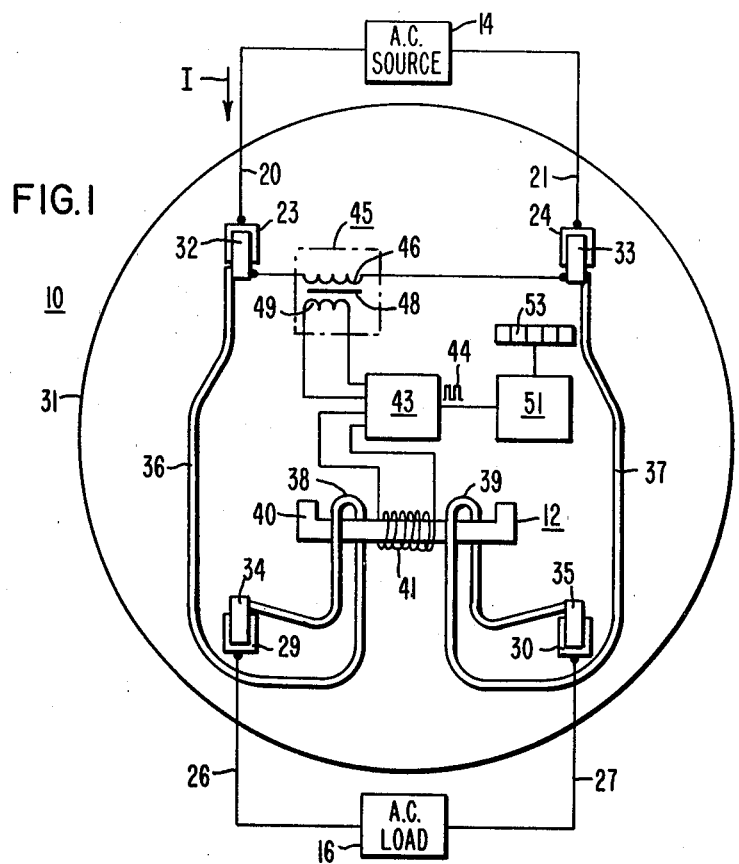
FIG. 1 is a diagrammatic view including an electrical circuit diagram of an AC electric energy meter including a mutual inductance current sensing transducer made in accordance with the present invention.

Referring now to the drawings, and more particularly to FIG. 1, an AC electric energy or watthour meter 10 is shown including a mutual inductance current sensing transducer 12 made in accordance with the present invention. The meter 10 is illustrated in one exemplary embodiment as it is connected between a sixty Hertz source 14 of AC electric energy and an electric load 16. Measurement of the consumption of electric energy by the load 16 is provided by the meter 10. As is well known, the electric energy quantity to be measured is in kilowatt-hours computed from a line voltage V component and a line current I component. Line side hot wire conductors 20 and 21 connect the voltage and current of the source 14 to the meter socket terminals 23 and 24. Load side hot wire conductors 26 and 27 connect the other socket terminals 29 and 30, respectively, to the load 16. A grounded neutral conductor, not shown, is associated with the conductors 20-21 and 26-27. The four socket terminals are of a conventional type provided in a meter-mounting box, not shown, for receiving an induction type watthour meter.

The meter 10 includes a housing 31 shown in FIGS. 2 and 3 conventionally used for induction type kilowatt-hour meters. At least four blade terminals 32, 33, 34 and 35 are carried by the housing 31 for mating with the socket terminals 23, 24, 29 and 30, respectively. Current carrying conductors 36 and 37 of the meter 10 provide series connections between the terminals 32 and 34, and 33 and 35, respectively, as shown in FIG. 1, to connect the source 14 to the load 16. These connections are used for conventional three wire single phase service from a typical power line subdistribution network; however, the present invention is equally usable with a two wire service where only one hot line conductor rather than two hot line conductors are sensed. Thus, the voltage V has conventional levels of one hundred-twenty or two hundred-forty volts and the current I has typical variations to be linearly sensed between one-half and two hundred amperes and applied to the load 16 when having different load impedance values to produce the current variations.

The current sensing transducer 12, described further hereinbelow, includes a magnetically permeable core 40 and conductor portions 38 and 39 of the conductors 36 and 37, respectively, partially encircling the core 40. The conductor portions 38 and 39 form primary windings of the transducer 12 inductively coupled to the core 40 as the current I passes through the conductors 36 and 37. A secondary output winding 41 is also wound in close inductively coupled relationship with the core 40 to produce the sensed current responsive analog signal $e_i$, which is proportional to the derivative with respect to time of the line current I or di/dt. In the transducer 12 the signal $e_i$ is proportional to the two line current components applied to the primary windings 38 and 39. An electronic AC electric energy measuring circuit 43 receives the signal $e_i$ and also a voltage responsive analog signal $e_v$ from a voltage sensing transducer 45. A potential transformer forms the transducer 45 wherein a primary winding 46 is wound on a laminated magnetic core 48 and is connected across the blade teminals 32 and 33 to be responsive to the line voltage V thereacross. The laminated core 48 also includes a secondary winding 49 for providing the voltage responsive analog signal $e_v$ to the measuring circuit 43.

Effectively, the AC electric energy measuring circuit 43 provides electric energy responsive pulse rate signal as disclosed and claimed in U.S. Pat. No. 4,182,983, filed concurrently herewith and assigned to the assignee of this invention. Pulse signals 44 from the circuit 43 are each representative of a quantized amount of alternating current electric energy. The pulse values are totalized or accumulated to provide cumulative readings of electric energy consumption in watthours. Also, the pulse signals from the circuit 43 may be applied to a programmable time-of-day type of electronic metering circuit 51, as disclosed in U.S. Pat. application Ser. Nos. 891,996 and 891,997, filed Mar. 31, 1978, now Pat. Nos. 4,197,582 and 4,298,839, respectively, both assigned to the assignee of this invention. As disclosed in the aforementioned applications, an electronic digital readout display 53 provides numerical readouts of time related parameters of an electric energy quantity to be measured.

FIGS. 2 and 3 illustrate a watthour meter housing 31 of a type used for induction watthour meters having a base 56, shown in FIG. 2, carrying the blade terminals 32, 33, 34 and 35 so that they extend from the rear thereof. A watthour meter cup-shaped cover 58 is carried by the outer periphery of the base 56 and provides a protected, enclosed space 60 forward of the front part of the base 56. A meter frame 61 carried on the front part of the base 56 is provided to carry the measuring parts of the meter 10. The current sensing transducer 12 and voltage sensing transducer 45 are carried on the frame in substantially the same manner that corresponding induction watthour meter electromagnet current and voltage sections are supported thereon. The current sensing and voltage sensing transducers 12 and 45 are connected to the blade terminals 32, 33, 34 and 35 as described and shown in FIG. 1, and also shown in FIG. 2. A plurality of circuit boards 63, 64, 65 and 66, shown in FIG. 2, carry the electronic components of the circuit 43 and 51 and also carry the digital readout display 53 and optical shield 68 forming part of an optical link associated with the circuit 51 as described in the aforementioned application Ser. No. 891,997. Three secondary output conductors 70, 71 and 72 from the secondary winding 48 of the voltage transducer 45 apply the voltage responsive analog signal $e_v$ to the AC electric energy measuring circuit 43. Two conductors can provide the output signal $e_v$ depending upon the input circuit requirements. The secondary output conductors 74 and 75 from the secondary winding 41 of the current transducer 12 apply the current responsive analog signal $e_i$ to the measuring circuit 43.

Referring now in further detail to the mutual inductance current sensing transducer 12 of this invention shown in FIGS. 2 and 3, the laminated magnetically permeable core 40 is identical to that used in an induction watthour meter type D4S available from Westinghouse Electric Corp., Meter-Low Voltage Instrument Transformer Division, Raleigh, NC. The known characteristics of the primary windings 38 and 39 are to have very low impedances approximately a few hundred or less microhms. Shunt bars 76 are mounted across the air gap 78 on both sides of the core 40. The shunt bars are formed by plural magnetic strips separated by non-magnetic spacer strips to form a compensating arrangement to improve the linear response of the transducer 12 at low values of line current I. The magnetic characteristics of the shunt bars 76 saturate at higher values of line current I while providing low reluctance flux paths across the air gap 78 at low values of line current I. The general effects of the air gap 78 are reduced at low line currents by the shunts 76, but the air gap effect remains present throughout the measured line current ranges so that the core 40 does not magnetically saturate. It is believed that the initial permeability of the magnetic material of core 40 causes some non-linearity in the induced flux produced by the line current I. The shunt bars 76 compensate for the non-linearity by operating in the non-saturated characteristic thereof at the low current values. The shunts are effective at low current values to increase coupling by magnetically decreasing the reluctance of the air gap 78 or effectively decreasing the air gap.

The primary winding circuit portions 38 and 39 of the transducer 12 and the current conductors 36 and 37 are also substantially identical to those provided in the aforementioned type D4S of induction watthour meter. Each current conductor is capable of carrying two hundred amperes of the line current I. The principles of the present invention may be carried forth by the use of a single primary winding connected in series with the line current I being supplied to an electric load 16, as noted above. The secondary winding 41 of the transducer 12 includes three hundred turns of small diameter wire having #36 wire gauge size in one exemplary embodiment wound on the center of the leg of the core 40 opposite the air gap so as to produce low voltage signals capable of being applied to solid state electronic components of the measuring circuit 43. For proper operation of the transducer of this invention, the secondary winding has no substantial current flow and this condition requires connection of a high impedance in series with the secondary winding 41. In conventional current instrument transformers continuous cores are used with minimum or negligible air gaps therein. The current responsive analog signal $e_i$ has a typical maximum value in the order of five volts and a minimum voltage approximately 0.010 volt corresponding to line current I variations betweens two hundred amperes and one-half ampere. The output signal $e_i$ from the secondary conductors 74 and 75 is connectable to the relatively high impedance presented by the input of a measuring circuit, by example and not limitation, 50,000 to 100,000 ohms or higher.

As noted hereinabove, the analog signal $e_i$ is equal to the constant of mutual inductance between the circuit of the primary windings 38 and 39 and the circuit of the secondary winding 41 multiplied times the derivative with respect to time of the line current I through the primary windings. Thus, $e_i$ is equal to M di/dt or proportional to di/dt. It is to be understood that the term di/dt used herein is equal to the sum of the derivative with respect to time of the two line current components or di/dt equals $di_2/dt$ plus $di_2/dt$ or $d(i_1+i_2)/dt$. It is known that an electromotive force e is induced into one circuit by a change in current in the other circuit when the two circuits are close to each other. The coefficient or constant of mutual inductance M between the circuits is dependent upon the magnetic coupling of the primary and secondary coil curcuits and these characteristics are described in *Physics* by Erich Hausmann and E. P. Slack published by D. Van Nostrand Co. Inc., New York, N.Y., second edition, 1939, at pp. 435-439. As described at page 438, the mutual inductance M of two neighboring coils having individual inductances $L_1$ and $L_2$ is equal to $M=k\sqrt{L_1 \times L_2}$ where k is a measure of the closeness of coupling and k is equal to one if there is complete flux coupling and no leakage.

Figure 5:
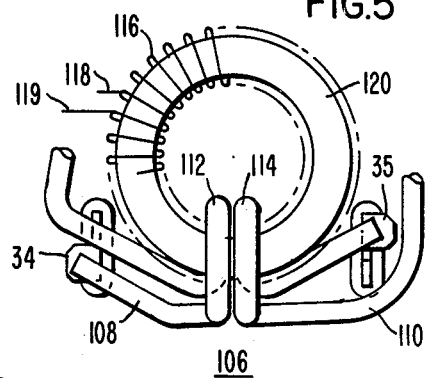
FIG. 5 is a front elevational view of an alternative mutual inductance current sensing transducer of the air core type for replacing the transducer shown in FIGS. 1, 2 and 3.

In the air core type of transducer, shown in FIG. 5, the coefficient of mutual inductance M will be dependent upon the number of turns in the primary and secondary windings, the area and shape of the windings, and the relative positioning of the windings. In the transducers disclosed herein there are two primary windings linking the secondary winding so that the voltage induced in the secondary is proportional to the fluxes of the two primary currents or $di_1/dt + di_2/dt$ as noted above. It is to be understood throughout this description that a single primary winding is usable in the present invention. Reference herein to line current I applied to a sensing transducer is meant to include the sum of the line currents applied thereto. In the two primary windings of each transducer described herein, such as windings 38 and 39, the individual fluxes are in mutual adding relationship. Thus, signal $e_i$ is proportional to the sum of the line current components applied to the transducers. The use of a soft magnetic iron core, such as the core 40, provides a confined and improved flux coupling path for the flux linkages coupling the windings so that relative positioning of the windings is less critical, but the mutual inductance is dependent upon the magnetic core characteristics. Magnetic shielding may be desirable for an air core mutual inductance transducer, described further with respect to FIG. 5 hereinbelow, when it is desired to avoid the effects of extraneous magnetic fields; however, such shielding is not generally required for the magnetic core type of transducer, such as transducer 12.

The magnetic core type of current sensing transducer 12 is dependent upon the permeability of conventionally available magnetic materials and the effects of the air gap space of the core 40 so that the signal $e_i$ is not exactly linearly proportional to the primary current, especially when the line current I therethrough is variable over wide ranges, such as in a ratio of one to four hundred. The use of the aforementioned shunt bar 76 aids in the compensation for non-linearities at low current values as noted hereinabove.

The current responsive analog signal $e_i$ being responsive to di/dt provides a signal which is useful in the AC electric energy measuring circuit disclosed and claimed in the U.S. Pat. No. 4,182,983, which may form the circuit 43. In operation, a common integrating circuit in the circuit 43 derives an analog current signal proportional to the line current I and a modulating signal to produce a pulse width modulated signals having a duty cycle proportional to the sensed line current I. The pulse width modulated signal is applied to a time division multiplier circuit, also receiving the voltage responsive analog signal $e_v$ to produce pulses having quantized values of measured electric energy in watthours. The analog signal $e_i$ may also be applied to an electronic integrating circuit to derive an analog signal directly proportional to the line current I, rather than a time derivative thereof for use in other known time division multiplier, quarter square, digital processing with analog-to-digital conversion or other types of known electric energy measuring circuits. The above-noted application describes a technique for further compensating for non-linearities in the output signal $e_i$ using electronic circuit techniques.

The analog signal $e_i$ is known to have a frequency and amplitude proportional to the line current I, but to have a 90 electrical degrees phase shift relationship thereto due to the mathematical derivative function effect of the mutual inductance characteristics of the mutual inductance transducer 12. The output $e_v$ of the voltage transducer 45 is proportional in amplitude and equal in frequency and phase relationship of the line voltage V.

Figure 4:
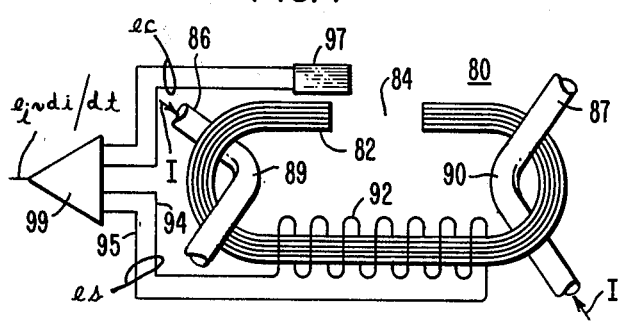
FIG. 4 is a perspective view of an alternative embodiment of the current sensing transducer shown in FIGS. 1, 2 and 3.

Referring now to FIG. 4, there is shown an alternative mutual inductance current sensing transducer 80 intended to replace the transducer 12 shown in FIGS. 1, 2 and 3. The transducer 80 is formed by a layered core 82 utilizing strips of permeable magnetic material, preferably being an oriented magnetic steel material having a high coefficient of initial permeability $\mu_O$ to improve the low current level linear response of such current sensing transducers. The laminated magnetic material of induction watt-hour meter current cores such as illustrated in FIGS. 1 and 2 is a less expensive material being an unoriented magnetic material. The layers of the core 82 are bent across the length or longitudinal axis thereof to form the general C-shaped configuration shown in FIG. 4 defining an air gap 84. Current conductors 86 and 87 form primary circuit windings 89 and 90 corresponding to the manner in which conductors 36 and 37 are formed with associated primary winding portions described above for the transducer 12. The secondary circuit winding 92 corresponds to the winding 41 so as to have output secondary conductors 94 and 95 for producing a current responsive analog signal $e_s$.

The transducer 80 further includes another compensation arrangement usable with the transducer 12 to improve the linear response thereof at low current levels. A pick-up coil 97, preferably formed on a bobbin, is positioned adjacent the air gap 84 so as to be responsive to the stray flux associated with the air gap. Such stray air gap magnetic flux is often non-linearly responsive to the levels of main flux in the core 82 and through the air gap 84 and, therefore, the primary winding current. The stray or leakage flux is higher in proportion to the main core flux at low levels of current I than at higher levels of the current I. This provides an output voltage from the pick-up coil 97 that is more responsive to the level of the current I at the low levels thereof. Since the response of the voltage produced by the secondary winding 92 is less responsive, at low current levels, in some instances, the output $e_c$ of the coil 97 and the output $e_s$ of the winding 92 are applied to a summing amplifier circuit 99. The output of the amplifier 99 produces a compensated and more linearly current responsive analog signal $e_i$ proportional to the time derivative of the sum of the line currents or di/dt. The output of the amplifier 99 may be applied to an electric energy measuring circuit, such as 43, to produce the current responsive signal for use in computation of the electric energy quantity to be measured, as noted hereinabove.

FIG. 5 illustrates an air core mutual inductance current sensing transducer 106 which is not to scale. Two primary circuit current conductors 108 and 110 correspond to current conductors 26 and in 37 in FIG. 3 and include symmetrical flux adding primary winding portions 112 and 114. A secondary winding 116 has output lead conductors 118 and 119, corresponding to lead conductors 74 and 75, and is wound on a non-magnetic core from 120 having a permeability substantially equal to air. The analog signal $e_i$, proportional to the time derivative of the sum of the line currents, as described hereinabove, is produced at the conductors 118 and 117. It is especially desirable that the primary winding or coil portions 112 and 114 have mirror image like symmetrical relationships to each other and to the secondary winding 116. The primary windings 112 and 114 preferably extend to the center of the ring defined by the secondary winding 116 while winding 116 extends through the center of the windings 112 and 114. The secondary winding is symmetrically and evenly disposed about the coil form 120. The aforementioned symmetrical alignment of the windings is substantially less sensitive to outside or extraneous magnetic fields whose effects are cancelled by the symmetrical arrangement.

In one form of the transducer 106, a secondary winding 92 of almost two thousand turns produces an $e_i$ signal of 403 millivolts for a line current I of 200 amperes and 1.05 millivolts for a line current I of one-half ampere.

It will be apparent to those skilled in the art that certain alternatives and modifications of the embodiments as described hereinabove may be made without departing from the spirit and scope of this invention.

I claim:

1. An AC electric energy meter comprising:

an electronic measuring circuit processing analog signals responsive to the line current and the line voltage components of an alternating current electric energy quantity to be measured for producing electronic signals representative of quantized amounts of electric energy;

means for producing an analog signal responsive to said line voltage component; and current sensing transducer means for producing an output signal proportional to said line current component, said current sensing transducer means including conductor means for series connection with said line current component, said conductor means having a primary winding portion for producing magnetic flux responsive to variations of said line current component; said transducer means further including a secondary winding; said transducer means still further including a magnetic core made of a soft magnetic material having said primary winding portion and said secondary winding disposed about said magnetic core in an inductively coupled relationship, said magnetic core further having opposite ends separated by a space equivalent to a predetermined air gap so that said magnetic core and the space between the ends thereof couple said magnetic flux with said secondary winding for having an electromotive force generated therein proportional to the time derivative of said magnetic flux, and said secondary winding having a pair of output conductors for producing a current responsive analog signal having a voltage proportional to the time derivative of the line current component for connection to a high impedance low level signal input circuit of said electronic measuring circuit;

said current sensing transducer means including magnetically saturable shunt bar members which extend from one to the other of said opposite ends of said magnetic core for partially shunting said magnetic flux across said core space and being operable in a substantially unsaturated condition only below a predetermined low level of said magnetic flux to provide compensation for magnetic flux in said core at low levels of input current to said transducer means.

2. An AC electric energy meter as claimed in claim 1 wherein said current responsive analog signal has a variable voltage proportional to variations of said line current component time derivative when the line current variations have minimum to maximum measured values in a ratio of one to four hundred.

3. An AC electric energy meter as claimed in claim 1 wherein said primary winding is formed by a single turn of said conductor means.

* * * * *